United States Patent
Pierrat et al.

(10) Patent No.: US 7,236,916 B2
(45) Date of Patent: Jun. 26, 2007

(54) STRUCTURE AND METHOD OF CORRECTING PROXIMITY EFFECTS IN A TRI-TONE ATTENUATED PHASE-SHIFTING MASK

(75) Inventors: Christophe Pierrat, Santa Clara, CA (US); Youping Zhang, Newark, CA (US)

(73) Assignee: Synopsys, Inc., Mountain View, CA (US)

(*) Notice: Subject to any disclaimer, the term of this patent is extended or adjusted under 35 U.S.C. 154(b) by 573 days.

(21) Appl. No.: 10/658,933

(22) Filed: Sep. 9, 2003

(65) Prior Publication Data

US 2004/0048170 A1   Mar. 11, 2004

Related U.S. Application Data

(62) Division of application No. 09/746,369, filed on Dec. 20, 2000, now Pat. No. 6,653,026.

(51) Int. Cl.
G06F 17/50 (2006.01)
(52) U.S. Cl. .......................... 703/13; 716/19; 716/21; 430/5; 359/290
(58) Field of Classification Search ............. 716/19, 716/21; 703/13; 430/5; 359/290; 530/311
See application file for complete search history.

(56) References Cited

U.S. PATENT DOCUMENTS

| 4,037,918 A | 7/1977 | Kato ............................ 350/3.5 |
| 4,231,811 A | 11/1980 | Somekh et al. ............... 148/1.5 |
| 4,426,584 A | 1/1984 | Bohlen et al. ............ 250/492.2 |
| 4,456,371 A | 6/1984 | Lin .............................. 355/71 |
| 4,812,962 A | 3/1989 | Witt ........................... 364/490 |
| 4,890,309 A | 12/1989 | Smith et al. .................. 378/35 |
| 4,895,780 A | 1/1990 | Nissan-Cohen et al. ........ 430/5 |
| 4,902,899 A | 2/1990 | Lin et al. ................. 250/492.1 |
| 5,051,598 A | 9/1991 | Ashton et al. ........... 250/492.2 |
| 5,182,718 A | 1/1993 | Harafuji et al. ............. 364/490 |
| 5,208,124 A | 5/1993 | Sporon-Fiedler et al. ...... 430/5 |
| 5,241,185 A | 8/1993 | Meiri et al. ............. 250/492.2 |

(Continued)

FOREIGN PATENT DOCUMENTS

DE    195 45 163 A1    6/1996

(Continued)

OTHER PUBLICATIONS

Kachwala et al□□High Transmission Attenuated PSM—Benefits and Limitations through a Validation Study of 33%, 205 and 6% Transmission Masks□□Optical Microlithography XIII, Feb. 27-Mar. 3, 2000, Santa Clara, California, USA.*

*Primary Examiner*—Kamini Shah
*Assistant Examiner*—Cuong Luu
(74) *Attorney, Agent, or Firm*—Bever, Hoffman & Harms, LLP; Jeanette S. Harms

(57) ABSTRACT

A structure and method are provided for correcting the optical proximity effects on a tri-tone attenuated phase-shifting mask. An attenuated rim, formed by an opaque region and an attenuated phase-shifting region, can be kept at a predetermined width across the mask or for certain types of structures. Typically, the attenuated rim is made as large as possible to maximize the effect of the attenuated phase-shifting region while still preventing the printing of larger portions of the attenuated phase-shifting region during the development process.

4 Claims, 9 Drawing Sheets

U.S. PATENT DOCUMENTS

| | | | | |
|---|---|---|---|---|
| 5,242,770 | A | 9/1993 | Chen et al. | 430/5 |
| 5,256,505 | A | 10/1993 | Chen et al. | 430/5 |
| 5,288,569 | A | 2/1994 | Lin | 430/5 |
| 5,302,477 | A | 4/1994 | Dao et al. | 430/5 |
| 5,308,741 | A | 5/1994 | Kemp | 430/312 |
| 5,316,878 | A | 5/1994 | Saito et al. | 430/5 |
| 5,324,600 | A | 6/1994 | Jinbo et al. | 430/5 |
| 5,328,807 | A | 7/1994 | Tanaka et al. | 430/311 |
| 5,334,542 | A | 8/1994 | Saito et al. | 437/40 |
| 5,340,700 | A | 8/1994 | Chen et al. | 430/312 |
| 5,352,550 | A | 10/1994 | Okamoto | 430/5 |
| 5,364,716 | A | 11/1994 | Nakagawa et al. | 430/5 |
| 5,424,154 | A | 6/1995 | Borodovsky | 430/5 |
| 5,447,810 | A | 9/1995 | Chen et al. | 430/5 |
| 5,480,746 | A | 1/1996 | Jinbo et al. | 430/5 |
| 5,496,666 | A | 3/1996 | Chu et al. | 430/5 |
| 5,498,579 | A | 3/1996 | Borodovsky et al. | 437/250 |
| 5,503,951 | A | 4/1996 | Flanders et al. | |
| 5,523,186 | A | 6/1996 | Lin et al. | 430/5 |
| 5,527,645 | A | 6/1996 | Pati et al. | 430/5 |
| 5,532,090 | A | 7/1996 | Borodovsky | 430/5 |
| 5,537,648 | A | 7/1996 | Liebmann et al. | 395/500 |
| 5,538,815 | A | 7/1996 | Oi et al. | 430/5 |
| 5,539,568 | A | 7/1996 | Lin et al. | 359/285 |
| 5,553,273 | A | 9/1996 | Liebmann | 395/500 |
| 5,553,274 | A | 9/1996 | Liebmann | 395/500 |
| 5,565,286 | A | 10/1996 | Lin | |
| 5,573,890 | A | 11/1996 | Spence | 430/311 |
| 5,595,843 | A | 1/1997 | Dao | 430/5 |
| 5,620,816 | A | 4/1997 | Dao | 430/5 |
| 5,631,110 | A | 5/1997 | Shioiri et al. | 430/5 |
| 5,635,316 | A | 6/1997 | Dao | 430/5 |
| 5,636,002 | A | 6/1997 | Garofalo | 355/53 |
| 5,636,131 | A | 6/1997 | Liebmann et al. | 364/490 |
| 5,657,235 | A | 8/1997 | Liebmann et al. | 364/474.24 |
| 5,663,017 | A | 9/1997 | Schinella et al. | 430/5 |
| 5,663,893 | A | 9/1997 | Wampler et al. | 364/491 |
| 5,682,323 | A * | 10/1997 | Pasch et al. | 716/19 |
| 5,702,848 | A | 12/1997 | Spence | 430/5 |
| 5,705,301 | A | 1/1998 | Garza et al. | 430/5 |
| 5,707,765 | A | 1/1998 | Chen | 430/5 |
| 5,723,233 | A | 3/1998 | Garza et al. | 430/5 |
| 5,725,969 | A | 3/1998 | Lee | |
| 5,740,068 | A | 4/1998 | Liebmann et al. | 364/489 |
| 5,761,075 | A | 6/1998 | Oi et al. | 364/488 |
| 5,766,804 | A | 6/1998 | Spence | 430/5 |
| 5,766,806 | A | 6/1998 | Spence | 430/5 |
| 5,807,649 | A | 9/1998 | Liebmann et al. | 430/5 |
| 5,815,685 | A | 9/1998 | Kamon | 395/500 |
| 5,821,014 | A | 10/1998 | Chen et al. | 430/5 |
| 5,825,647 | A | 10/1998 | Tsudaka | 364/167.03 |
| 5,827,623 | A | 10/1998 | Ishida et al. | 430/5 |
| 5,847,959 | A | 12/1998 | Veneklasen et al. | 364/468.28 |
| 5,858,580 | A | 1/1999 | Wang et al. | 430/5 |
| 5,862,058 | A | 1/1999 | Samuels et al. | 364/491 |
| 5,863,682 | A | 1/1999 | Abe et al. | 430/30 |
| 5,879,844 | A | 3/1999 | Yamamoto et al. | 430/30 |
| 5,885,734 | A | 3/1999 | Pierrat et al. | 430/5 |
| 5,900,338 | A | 5/1999 | Garza et al. | 430/5 |
| 5,923,566 | A | 7/1999 | Galan et al. | 364/489 |
| 5,958,635 | A | 9/1999 | Reich et al. | 430/30 |
| 5,972,541 | A | 10/1999 | Sugasawara et al. | 430/5 |
| 5,994,002 | A | 11/1999 | Matsuoka | 430/5 |
| 5,998,068 | A | 12/1999 | Matsuoka | 430/5 |
| 6,004,702 | A | 12/1999 | Lin | |
| 6,007,310 | A | 12/1999 | Jacobsen et al. | 417/362 |
| 6,010,807 | A | 1/2000 | Lin | |
| 6,057,063 | A | 5/2000 | Liebmann et al. | 430/5 |
| 6,066,180 | A | 5/2000 | Kim et al. | 716/19 |
| 6,077,310 | A * | 6/2000 | Yamamoto et al. | 716/19 |
| 6,077,630 | A | 6/2000 | Pierrat | 430/5 |
| 6,078,738 | A | 6/2000 | Garza et al. | 395/500.22 |
| 6,081,658 | A | 6/2000 | Rieger et al. | 395/500.22 |
| 6,083,275 | A | 7/2000 | Heng et al. | 716/19 |
| 6,114,071 | A | 9/2000 | Chen et al. | 430/5 |
| 6,228,539 | B1 | 5/2001 | Wang et al. | 430/5 |
| 6,249,597 | B1 | 6/2001 | Tsudaka | 382/144 |
| 6,251,549 | B1 | 6/2001 | Levenson | 430/11 |
| 6,258,493 | B1 | 7/2001 | Wang et al. | 430/5 |
| 6,289,499 | B1 | 9/2001 | Rieger et al. | 716/21 |
| 6,312,854 | B1 | 11/2001 | Chen et al. | 430/5 |
| 6,370,679 | B1 * | 4/2002 | Chang et al. | 716/19 |
| 6,420,074 | B2 * | 7/2002 | Wang et al. | 430/5 |
| 6,425,117 | B1 * | 7/2002 | Pasch et al. | 716/21 |
| 6,470,489 | B1 * | 10/2002 | Chang et al. | 716/21 |
| 6,503,666 | B1 * | 1/2003 | Pierrat | 430/5 |
| 6,578,188 | B1 * | 6/2003 | Pang et al. | 716/19 |
| 6,747,783 | B1 * | 6/2004 | Sandstrom | 359/290 |
| 6,757,645 | B2 * | 6/2004 | Chang et al. | 703/13 |
| 6,861,204 | B2 * | 3/2005 | Cote et al. | 430/311 |
| 2002/0035461 | A1 * | 3/2002 | Chang et al. | 703/13 |
| 2002/0160278 | A1 * | 10/2002 | Winder et al. | 430/5 |

FOREIGN PATENT DOCUMENTS

| | | |
|---|---|---|
| EP | 0 464 492 A1 | 1/1992 |
| EP | 0 653 679 A2 | 5/1995 |
| EP | 0 698 821 | 2/1996 |
| GB | 2324169 A | 10/1998 |
| JP | 62067547 | 3/1987 |
| JP | 7-111528 | 2/1991 |
| JP | 3-80525 | 4/1991 |
| JP | 3-210560 | 9/1991 |
| JP | 6-67403 | 3/1994 |
| JP | 8-51068 | 2/1996 |
| JP | 8-236317 | 9/1996 |
| JP | 2638561 | 4/1997 |
| JP | 2650962 | 5/1997 |
| JP | 10-133356 | 5/1998 |
| JP | 11-143085 | 5/1999 |
| WO | WO 97/45772 | 12/1997 |
| WO | WO 98/38549 | 9/1998 |
| WO | WO /99/27420 | 6/1999 |
| WO | WO 99/47981 | 9/1999 |

* cited by examiner

STRUCTURE AND METHOD OF CORRECTING PROXIMITY EFFECTS IN A TRI-TONE ATTENUATED PHASE-SHIFTING MASK

RELATED APPLICATION

The present application is a divisional of U.S. patent application Ser. No. 09/746,369, now U.S. Pat. No. 6,653,026 B1, filed by Christophe Pierrat and Youping Zhang on Dec. 20, 2000.

BACKGROUND OF THE INVENTION

1. Field of the Invention

The present invention relates to a phase-shifting mask, and in particular to a structure and method of correcting proximity effects in a tri-tone attenuated phase-shifting mask.

2. Description of the Related Art

Photolithography is a well-known process used in the semiconductor industry to form lines, contacts, and other known structures in integrated circuits (ICs). In conventional photolithography, a mask (or a reticle) having a pattern of transparent and opaque regions representing such structures in one IC layer is illuminated. The emanating light from the mask is then focused on a photoresist layer provided on a wafer. During a subsequent development process, portions of the photoresist layer are removed, wherein the portions are defined by the pattern. In this manner, the pattern of the mask is transferred to or printed on the photoresist layer.

However, diffraction effects at the transition of the transparent regions to the opaque regions can render these edges indistinct, thereby adversely affecting the resolution of the photolithography process. Various techniques have been proposed to improve the resolution. One such technique, phase-shifting, uses phase destructive interference of the waves of incident light. Specifically, phase-shifting shifts the phase of a first region of incident light waves approximately 180 degrees relative to a second, adjacent region of incident light waves to create a more sharply defined interface between the first and second regions. Thus, the boundary between exposed and unexposed portions of a photoresist illuminated through a semiconductor mask (or reticle) can be more closely defined by using phase-shifting, thereby allowing greater structure density on the IC.

FIG. 1 illustrates a simplified, phase-shifting mask 100 fabricated with an attenuated, phase-shifting region 101 formed on a clear region 102, wherein a border 103 of attenuated, phase-shifting region 101 defines a single IC structure. Clear region 102 is transparent, i.e. a region having an optical intensity transmission coefficient T>0.9. In contrast, attenuated phase-shifting region 101 is a partially transparent region, i.e. a region having a low optical intensity transmission coefficient 0.03<T<0.1. The phase shift of light passing through attenuated phase-shifting region 101 relative to light passing through clear region 102 is approximately 180 degrees.

As known by those skilled in the art, increasing the intensity transmission coefficient of attenuated phase-shifting region 101 could increase the performance of structures formed by the photolithographic process. In fact, optimal performance would be theoretically achieved by providing an attenuated, phase-shifting region with an optical intensity transmission coefficient approaching T=1 (in other words, the region would be transparent) yet having a phase shift of 180 degrees relative to clear region 102. In this manner, assuming partially coherent illumination, amplitude side lobes from each region would substantially cancel, thereby creating a substantially zero-intensity line at the transition between these two regions. Current material technology typically provides this phase shift with an attenuated, phase-shifting region having an optical intensity transmission coefficient of approximately T=0.4, although a higher transmission is theoretically possible and preferable.

Unfortunately, the use of this higher transmission phase-shifting material increases the risk of printing certain portions of attenuated phase-shifting region 101. Specifically, to ensure complete removal of residual photoresist, the actual dose used to remove the photoresist is typically at least twice the theoretical dose needed to remove the photoresist. This over-exposure can result in increasing the risk of printing certain larger portions of attenuated phase-shifting region 101.

To solve this problem, some masks, called tri-tone attenuated phase-shifting masks, include an opaque region within the larger portion(s) of the attenuated, phase-shifting region, wherein the opaque region blocks any unwanted light transmitted by the attenuated phase-shifting region. FIG. 2 illustrates a simplified, phase-shifting mask 200 fabricated with an attenuated phase-shifting region 201 formed on a clear region 202 and an opaque region 204 formed on attenuated phase-shifting region 201, wherein a border 203 of attenuated phase-shifting region 201 defines a single IC structure. In this embodiment, clear region 202 has an optical intensity transmission coefficient T>0.9, attenuated phase-shifting region 201 has an optical intensity transmission coefficient 0.3<T<0.9, and an opaque region 204 typically has an intensity transmission coefficient of T<0.01. Note that the phase shift of light passing through attenuated phase-shifting region 201 relative to light passing through clear region 202 remains approximately 180 degrees.

Thus, forming an opaque region on an attenuated phase-shifting region advantageously allows for the use of a significantly higher optical intensity transmission coefficient for isolated structures. Unfortunately, a tri-tone phase-shifting mask exhibits strong optical proximity effects, thereby making it difficult to utilize this mask in a single common exposure for both isolated as well as crowded patterns.

Therefore, a need arises for a structure and a method for correcting optical proximity effects on a tri-tone, attenuated phase-shifting mask.

SUMMARY OF THE PRESENT INVENTION

A structure and method are provided for correcting the optical proximity effects on a tri-tone phase-shifting mask. A tri-tone phase-shifting mask typically includes a plurality of attenuated phase-shifting regions formed on a transparent layer as well as opaque regions formed on the larger portions of the attenuated, phase-shifting regions to block any unwanted light transmitted by the attenuated phase-shifting regions. In this manner, the opaque regions prevent these larger portions of the attenuated phase-shifting regions from printing during the development process.

In accordance with the present invention, a rim, formed by an opaque region and an attenuated phase-shifting region, is kept at a predetermined width either for all structures of a certain type or for all structures across the mask. Typically, the rim is made as large as possible to maximize the effect of the attenuated phase-shifting region while still preventing the printing of larger portions of the attenuated phase-shifting region during the development process.

In accordance with one feature of the present invention, a photolithographic mask includes a plurality of structures. Some of the structures are formed with a transparent region, an opaque region, and an attenuated region. The opaque region and the attenuated region form an attenuated rim having a predetermined width. In the present invention, the width of this rim is substantially the same in the subset of structures.

In one embodiment, the transparent region provides approximately a 0 degree phase shift and has an optical intensity transmission coefficient greater than approximately 0.9, whereas the attenuated region provides approximately a 180 degree phase shift and has an optical intensity transmission coefficient between approximately 0.3 and approximately 1.0. In this embodiment, the opaque region has an optical intensity transmission coefficient of less than approximately 0.01.

In accordance with another feature of the present invention, a method of forming a plurality of structures in a tri-tone attenuated phase-shifting mask is provided. A subset of the structures are formed by a first region and a second region, wherein the first region has a phase shift relative to the second region of 180 degrees. The method includes positioning a third region within a boundary for the second region, thereby forming a rim of the second region. The third region prevents the second region from printing during the development process. In accordance with the invention, a predetermined rim width for the subset of structures is provided to correct for optical proximity.

In one embodiment, the first region includes a transparent region, the second region includes an attenuated region, and the third region includes an opaque region. In this embodiment, the method further includes dividing the border for the second region into a plurality of first segments, each first segment including two dissection points. A subset of the dissection points is projected onto a border for the third region, thereby forming a plurality of second segments At this point, optical proximity correction is provided for the subset of structures, wherein if an optical proximity correction moves a first segment, then a corresponding second segment moves. A modified border for the third region is determined based on a modified second region formed after optical proximity correction.

In one embodiment, determining the modified border for the third region includes downsizing the modified second region and then upsizing the downsized second region. For example, the modified second region can be downsized by twice the predetermined rim width and then upsized by the predetermined rim width. In another example, the modified second region is downsized by the predetermined rim width and then any resulting mousebites in the downsized second region are eliminated. In yet another example, the amount of downsizing and subsequent upsizing can be adjusted as a function of the optical proximity correction applied (i.e. size of the hammerhead, bias, serif, etc.). In yet another example, the amount of downsizing and subsequent upsizing takes into account any side-lobe printing that could occur inside the structure.

In another embodiment of the invention, optical proximity correction is provided for the subset of structures, however the border for the third region is not changed during this correction. Once again, the modified border for the third region is determined based on a modified second region formed after optical proximity correction. In one embodiment, the modified border for the third region is determined by downsizing the modified second region and then upsizing the downsized second region. For example, the modified second region can be downsized by twice the predetermined rim width and then upsized by the predetermined rim width. In another example, the amount of downsizing and subsequent upsizing can be adjusted as a function of the optical proximity correction applied (i.e. size of the hammerhead, bias, serif, etc.). In yet another example, the amount of downsizing and subsequent upsizing takes into account any side-lobe printing that could occur inside the structure. In yet another example, the modified second region is downsized by the predetermined rim width and then any resulting mousebites in the downsized second region are eliminated.

In accordance with another feature of the present invention, a method of fabricating a tri-tone attenuated phase-shifting mask includes the steps of forming a transparent layer and an attenuated layer, wherein a phase shift of the attenuated layer relative to the transparent layer is approximately 180 degrees. The attenuated layer is patterned, wherein a transition from a transparent portion to an attenuated portion defines an edge of a structure on the mask. An opaque layer is formed and patterned, wherein for each structure on the mask including an opaque portion, the opaque portion is located a predetermined distance from the edge.

The patterning of the attenuated and opaque layers is preceded by simulating optical proximity correction for the structures. In one embodiment, a transition from the opaque portion to the attenuated portion defines an edge of a rim, wherein simulating optical proximity correction includes moving segments of the edge of the rim if corresponding segments of the edge of the structure move. At this point, the attenuated portion can be downsized and then upsized. In one example, the attenuated portion can be downsized by twice the predetermined distance and then upsizing by the predetermined distance. In another example, the attenuated portion is downsized by the predetermined distance. In yet another example, the amount of downsizing and subsequent upsizing can be adjusted as a function of the optical proximity correction applied (i.e. size of the hammerhead, bias, serif, etc.). In yet another example, the amount of downsizing and subsequent upsizing takes into account any side lobe printing that could occur inside the structure.

In another embodiment, simulating optical proximity correction includes moving segments of the edge of the structure while fixing the edge of the rim. The attenuated portion can be downsized and then upsized. As indicated above, the downsizing and upsizing can be based on predetermined distances, a function of optical proximity correction, or adjusted to minimize any internal side lobe printing.

In accordance with another feature of the invention, a semiconductor mask comprises a plurality of structures. A subset of the structures includes a first region having an optical intensity transmission coefficient greater than 0.9, a second region having an optical intensity transmission coefficient of less than 0.01, and a third region having an optical intensity transmission coefficient between approximately 0.3 and approximately 1.0. In the present invention, the second region and the third region form a rim having a predetermined width, wherein the width is substantially the same in the subset of structures.

In accordance with another feature of the present invention, computer software for simulating a tri-tone attenuated phase-shifting mask is provided. The mask includes a plurality of structures, a subset of the structures including a transparent region, an opaque region, and an attenuated region. The opaque region and the attenuated region form a rim. The computer software includes means for analyzing optical proximity correction for the subset of the structures and means for providing a substantially similar rim width in the subset of the structures. In one embodiment, the means for providing includes means for dividing a first edge of the attenuated region into a plurality of first segments, means for dividing a second edge of the opaque region into a plurality of second segments, wherein each second segment corresponds to certain first segment, and means for determining whether a second segment moves with its corresponding first segment during optical proximity correction. The means for providing can also include means for downsizing the attenuated region and then upsizing the attenuated region to generate the substantially similar rim width. Alternatively, the means for providing can include means for downsizing the attenuated region to generate the substantially similar rim width.

DETAILED DESCRIPTION OF THE DRAWINGS

In accordance with the present invention, an attenuated rim, an area defined by subtracting an opaque region from an attenuated phase-shifting region, is kept at a predetermined width across a tri-tone attenuated phase-shifting mask, thereby correcting for optical proximity effects. Typically, the attenuated rim is made as large as possible to maximize the effect of the attenuated phase-shifting region while still preventing the printing of larger portions of the attenuated phase-shifting region during the development process.

Figure 1:
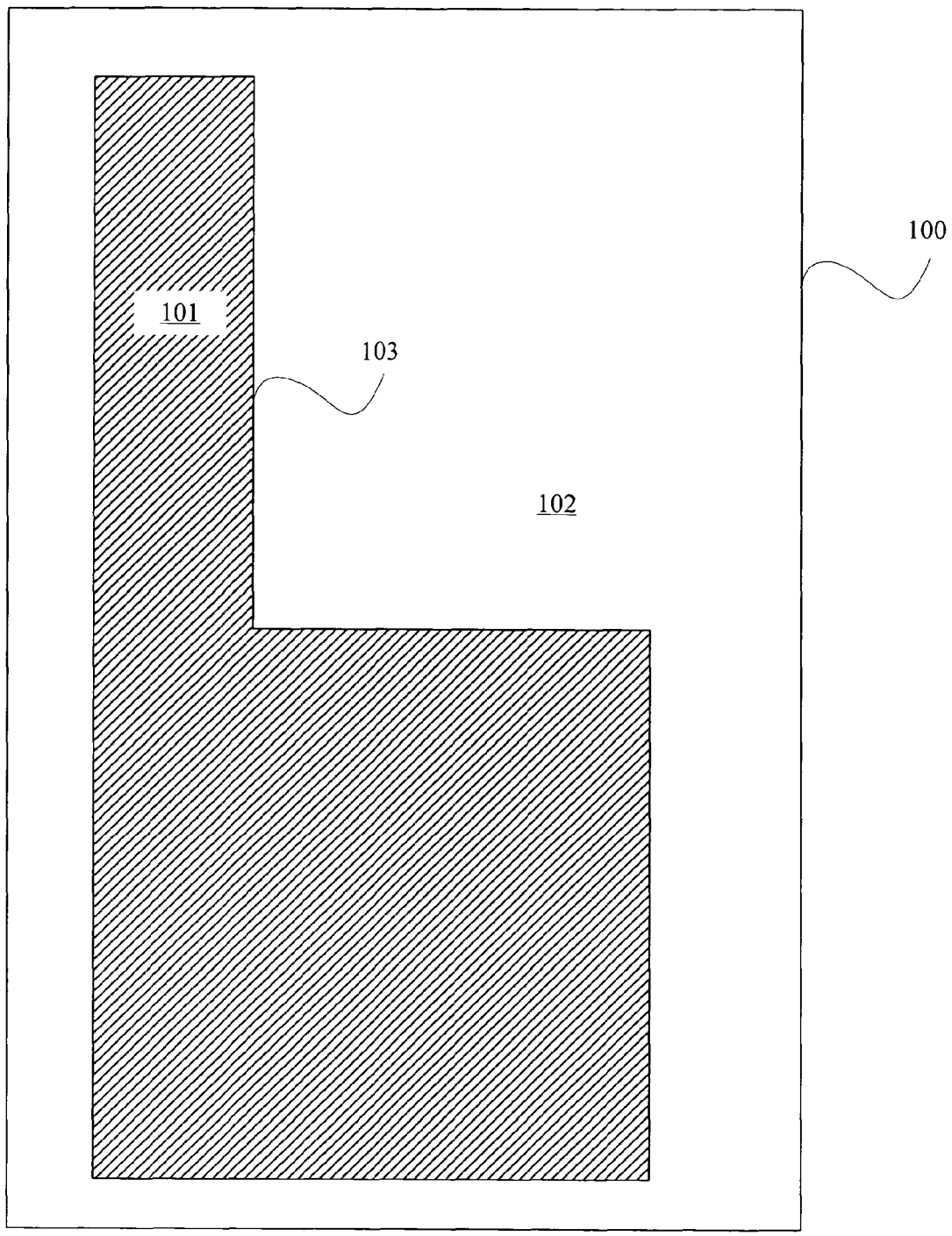
FIG. 1 illustrates a simplified, phase-shifting mask fabricated with an attenuated phase-shifting region formed on a clear region, wherein the border of the attenuated phase-shifting region defines a single IC structure.
Figure 2:
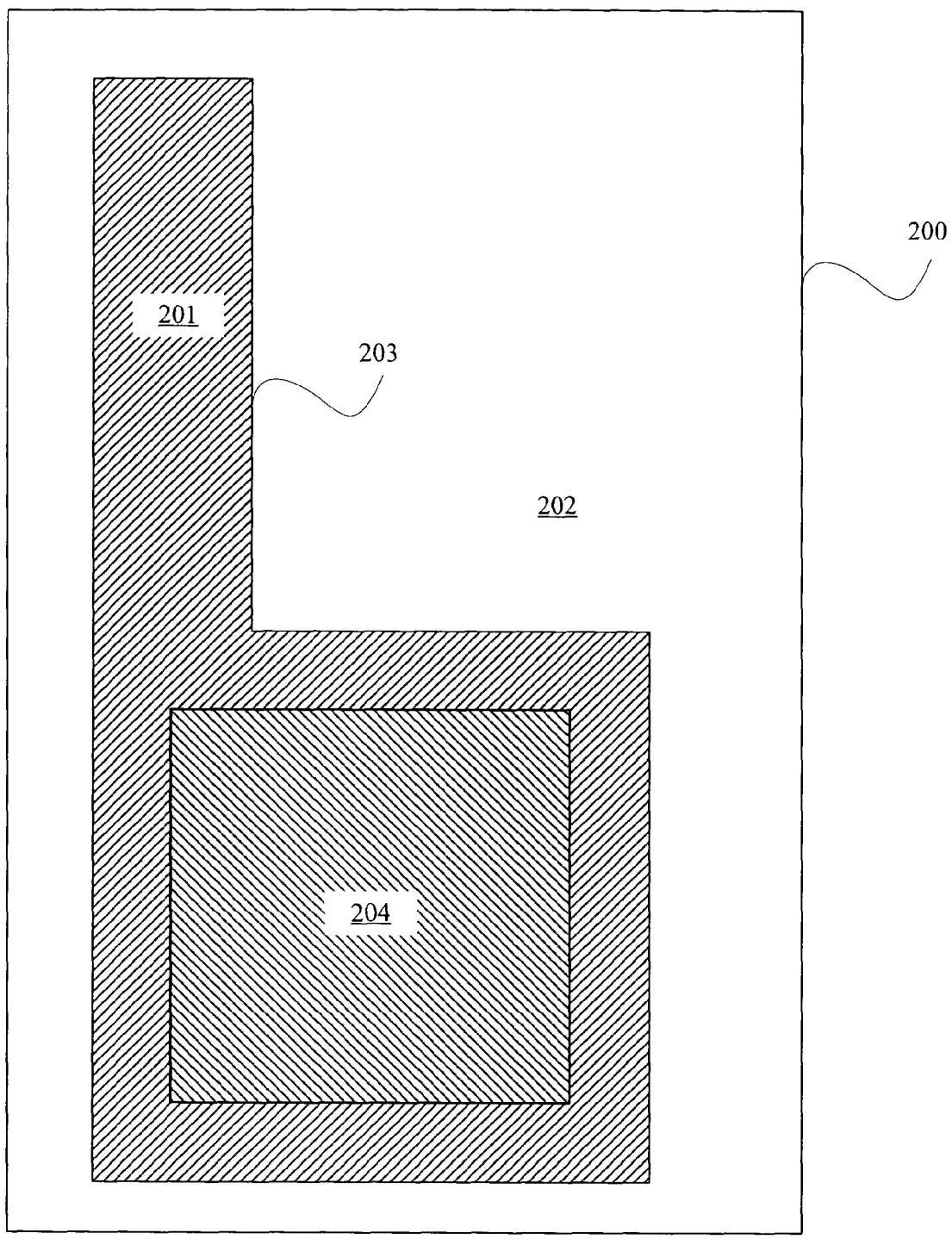
FIG. 2 illustrates a simplified, phase-shifting mask fabricated with an attenuated phase-shifting region formed on a clear region and an opaque region formed on the attenuated phase-shifting region, wherein the border of the attenuated phase-shifting region defines a single IC structure.
Figure 3:
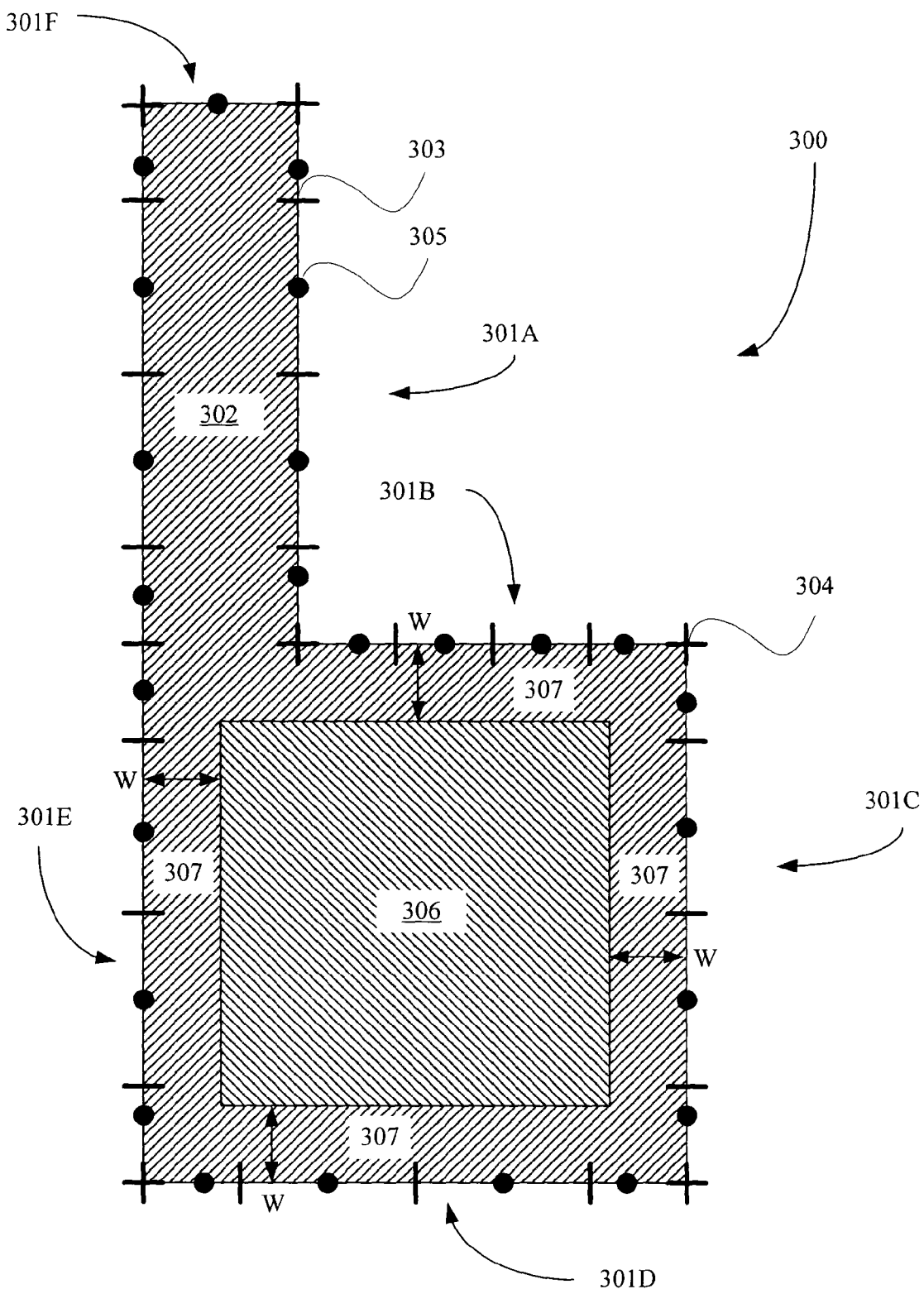
FIG. 3 illustrates a structure having a plurality of edges defining an attenuated phase-shifting region, wherein each edge includes dissection points and evaluation points in accordance with the present invention.

To create the desired attenuated rim, each edge associated with a transition between the attenuated phase-shifting region and the clear region is divided into segments, wherein each segment includes at least one evaluation point. For example, FIG. 3 illustrates a structure 300 having six edges 301A–301F defining the transition between an attenuated, phase-shifting region 302 and clear region (not shown). Each edge 301 includes a plurality of dissection points 303, wherein two adjacent dissection points 303 define a segment. Note that each corner 304 has two overlapping dissection points, one dissection point horizontally disposed and another dissection point vertically disposed. In this embodiment of the present invention, dissection points 303 define segments of two lengths. However, in other embodiments, dissection points can define segments of the same length or segments having three or more lengths.

An evaluation point 305 is located between two adjacent dissection points, i.e. in the middle of a segment or at some other designated position (such as, ⅔ of the distance from a dissection point positioned at a corner). Note that multiple evaluation points on each segment could increase the accuracy of the correction process, but adds complexity to the process. Therefore, for ease of explanation, each segment in the embodiment described herein includes a single evaluation point.

In accordance with one feature of the present invention, if an evaluation point 305 is moved to correct for optical proximity effects, then the segment associated with that evaluation point is moved at the same time. This technique as well as the positioning of the dissection and evaluation points are described in detail in U.S. patent application Ser. No. 09/675,582, entitled "Dissection Of Corners In A Fabrication Layout For Correcting Proximity Effects", filed on 29 Sep. 2000; U.S. patent application Ser. No. 09/676,197, entitled "Dissection Of Edges With Projection Points In A Fabrication Layout For Correcting Proximity Effects", filed on 29 Sep. 2000; U.S. patent application Ser. No. 09/676,375, entitled "Dissection of Printed Edges From A Fabrication Layout For Correcting Proximity Effects", filed on 29 Sep. 2000; and U.S. patent application Ser. No. 09/676,356, entitled "Selection Of Evaluation Point Locations Based On Proximity Effects Model Amplitudes For Correcting Proximity Effects In A Fabrication Layout", filed on 29 Sep. 2000, all of which are incorporated by reference herein.

Structure 300 further includes an opaque region 306 formed on attenuated phase-shifting region 302. In accordance with one embodiment of the invention, attenuated phase-shifting region 302 can be made of molybdenum silicide having a thickness of 50 to 200 nanometers and opaque region 306 can be made of chromium also having a thickness of 50 to 200 nanometers. In other embodiments of the invention, attenuated phase-shifting region 302 can be made of chrome oxy-nitride, chrome oxy-fluoride, zirconium silicide, silicon nitride, and aluminum oxide. Of importance, opaque region 306 need not be opaque by itself, but should have a thickness that in combination with the thickness of attenuated phase-shifting region 302 has an intensity transmission coefficient of approximately $T<0.01$. Other materials for opaque region 306 could include, for example, silicon, chromium oxynitride, aluminum, tungsten, and titanium. Note that the clear region (not shown in FIG. 3), on which both attenuated phase-shifting region 302 and opaque region 306 are formed, can be made of fused silica, borosilicate glass (used for wavelengths greater than 365 nanometers), or any other material having similar thermal expansion and intensity transmission coefficients. Blanks including layers of the above-described materials are provided by numerous suppliers, including but not limited to Dupont, Photomask, Hoya, Ulcoat, Dai Nippon Printing, and Toppan.

FIG. 3 indicates a desired (i.e. predetermined) width W for attenuated rim 307. This predetermined width W is determined by the following equation: W=k×λ/NA, wherein λ is the stepper wavelength, NA is the numerical aperture of the projection optic of the stepper, and k is a constant for a given process determined by the resist process used, the coherence of the stepper illuminator (including whether the illumination is performed on-axis or off-axis), and the transmission of the attenuated phase-shifting region.

Figure 4A:
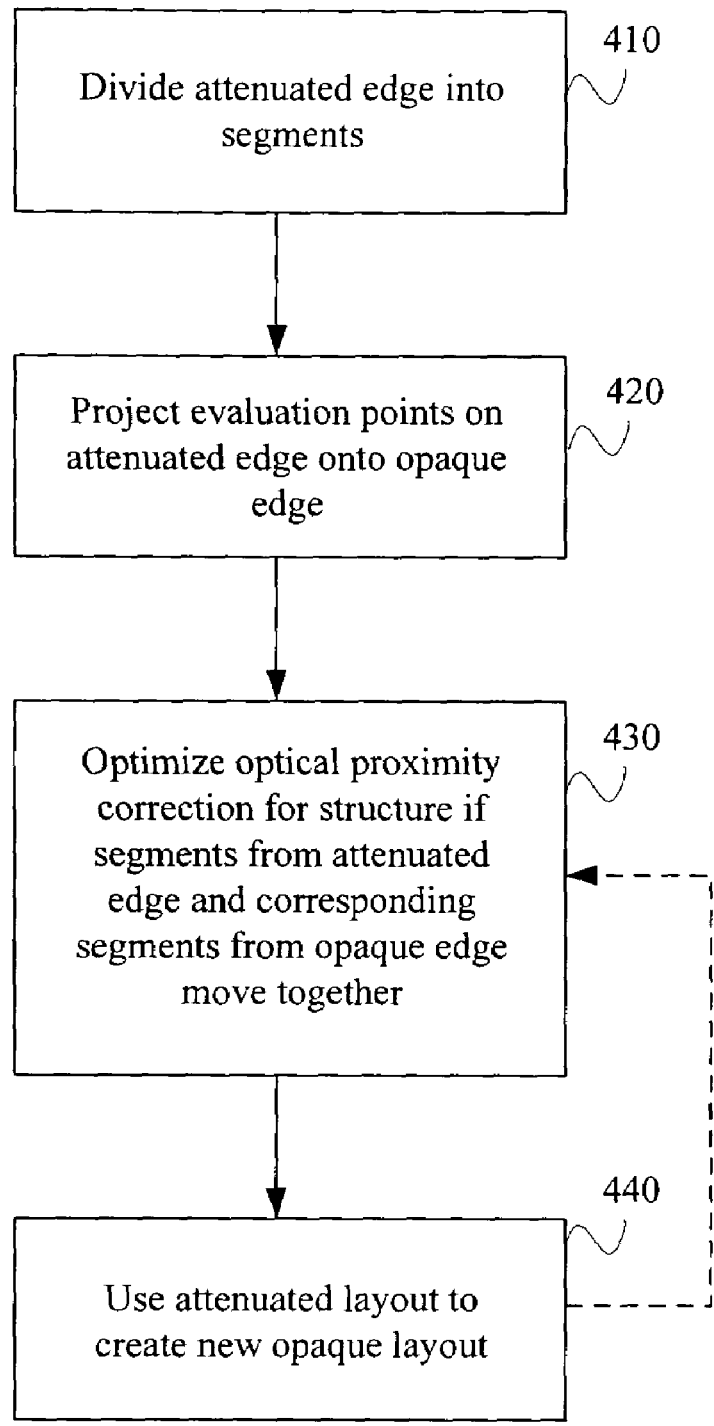
FIG. 4A illustrates one set of steps in accordance with the present invention to provide a substantially constant attenuated rim width across the layout of the integrated circuit.

FIG. 4A illustrates various steps in one embodiment of the invention to ensure that width W is achieved after structure 300 is corrected for optical proximity. In the present invention, these steps are performed on a layout structure using software until an optimized structure is formed. Then, the actual masks can be formed having the appropriate regions thereon, such as attenuated phase-shifting region 302 and opaque region 306.

Figure 4B:
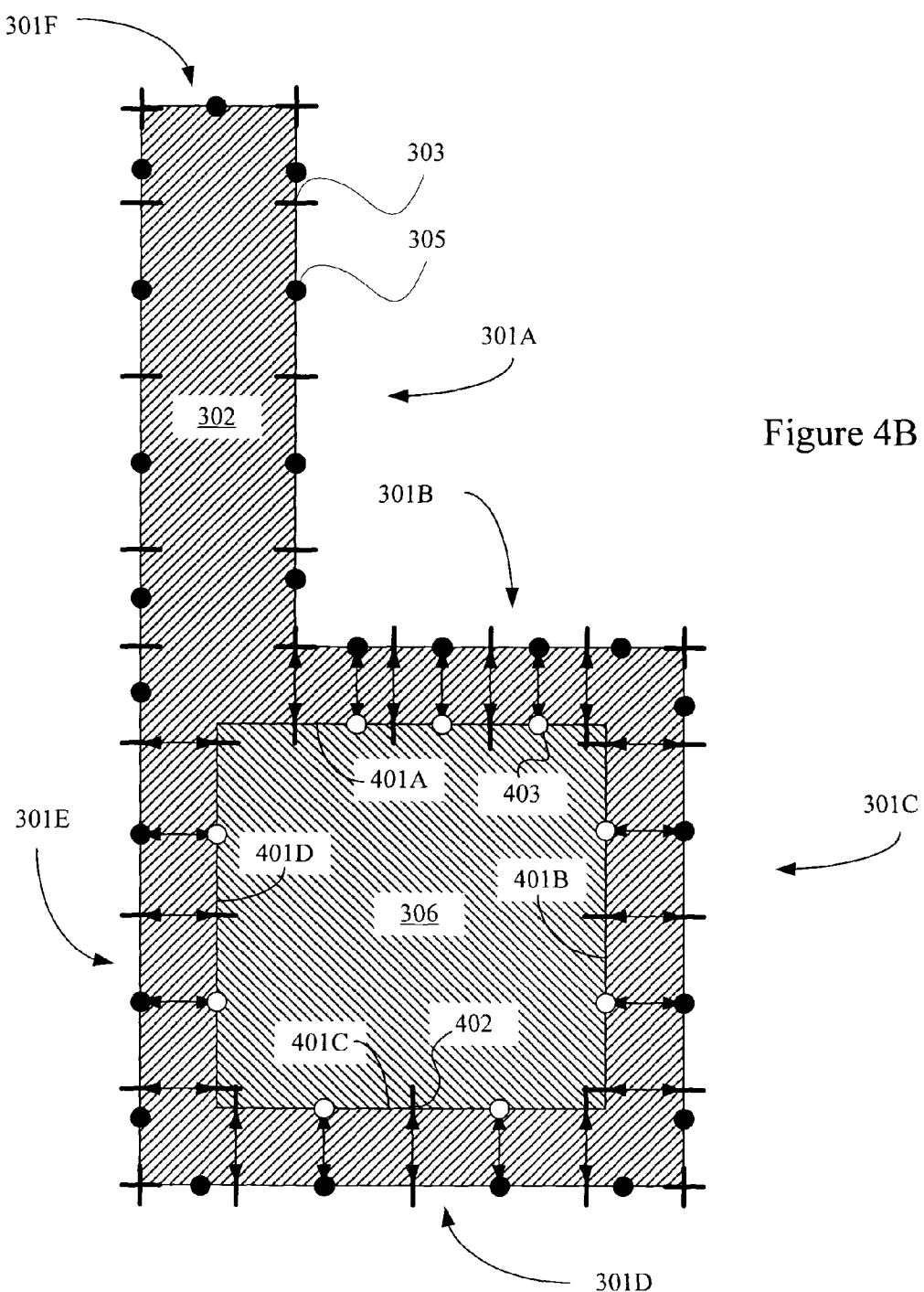
FIG. 4B illustrates various dissection and evaluation points on the edges of the attenuated phase-shifting region being projected onto the edges of the opaque region.

In this embodiment, as described above in reference to FIG. 3, edges 301 are divided into segments having evaluation points thereon in step 410. In step 420, and referring also to FIG. 4B, the dissection and evaluation points on edges 301B–301E of attenuated phase-shifting region 302 are projected onto edges 401A–401D, respectively, of opaque region 306. In this manner, each dissection point 402 and evaluation point 403 on an edge 401 has a corresponding dissection point 303 and evaluation point 305 on an edge 301. Two adjacent dissection points 402 define a segment having an evaluation point 403 thereon. Note that because edges 301A, 301F, and a top part of edge 301E define a small enough portion of attenuated phase-shifting region 302, there is no corresponding opaque region. (In other words, this portion has been determined not to be a risk of printing during the development process.) Therefore, the dissection points and evaluation points on those edges (or parts thereof) are not projected onto other edges.

At this point, optical proximity correction is performed on the structure in step 430. In accordance with this embodiment, if a segment of an edge 301 moves because of an optical proximity correction, then the corresponding segment of edge 401 (identified by the projected dissection and evaluation points) also moves. Of importance, optimizing optical proximity correction for a structure may take multiple iterations. In other words, after each iteration, a print simulation can be performed on the structure to determine if the placement of the evaluation points (FIG. 4B) can be further optimized to achieve the desired layout. Thus, the locations of numerous segments of edges 301 and 401 may be modified during this optical proximity correction step. Additionally, optical proximity correction (OPC) features, such as hammerheads, serifs, and biases, can be added to the structure in step 430.

Figure 4C:
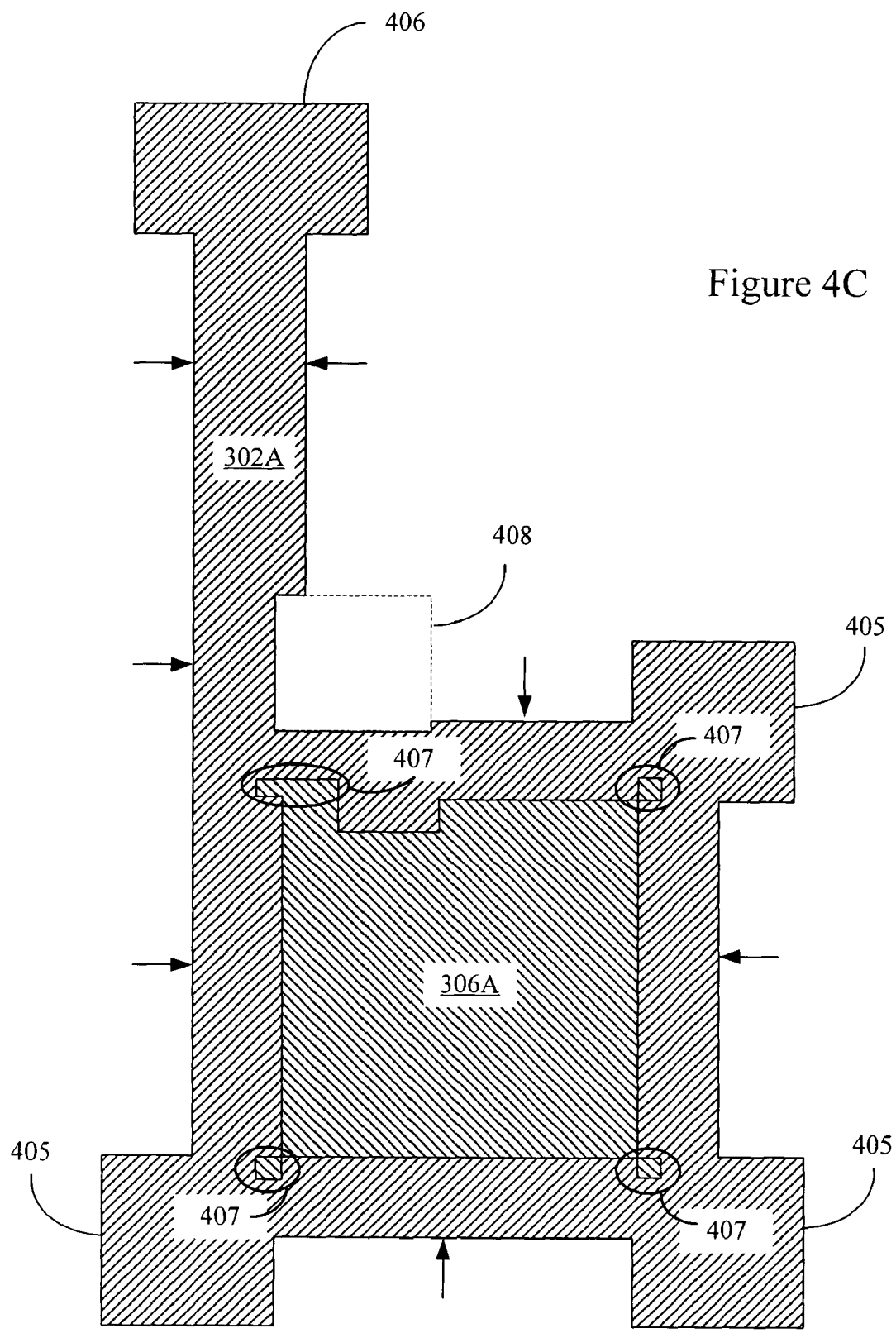
FIG. 4C illustrates the resulting edge modifications and additional OPC features to the attenuated phase-shifting region and the opaque region after standard optical proximity correction is performed.

FIG. 4C illustrates the resulting edge modifications and additional OPC features to attenuated phase-shifting region 302 and opaque region 306 after standard optical proximity correction is performed. Specifically, after optical proximity correction is performed on attenuated phase-shifting region 302, a hammerhead 406, an inner serif 408 (shown as a dotted box), and three outer serifs 405 have been added to the original structure. Moreover, the positions of various segments of edges 301 have been changed (an arrow indicating the direction of movement of the original segment(s) from an edge 301 (FIG. 4A)). Note that if a portion 407 of an edge 401 is not identified by an evaluation point (see FIG. 4A), then that portion 407 (defined by its corresponding dissection points) does not move during optical proximity correction.

At this point, the layout of attenuated phase-shifting region 302A can be used to create the desired layout for opaque region 306A in step 440. In one embodiment, the layout of attenuated phase-shifting region 302A is sized down and then sized up. Depending on the magnitude of the downsizing and upsizing, this operation can eliminate OPC features, such as hammerhead 406 and outer serifs 405, as well as any portion(s) of attenuated phase-shifting region 302A not having an associated opaque region 306A (for example, the portion of attenuated phase-shifting region 302A between hammerhead 406 and inner serif 408). Advantageously, this operation can also ensure that the resulting opaque layout is free of any "mousebites", such as portions 407 (FIG. 4C).

Figure 4D:
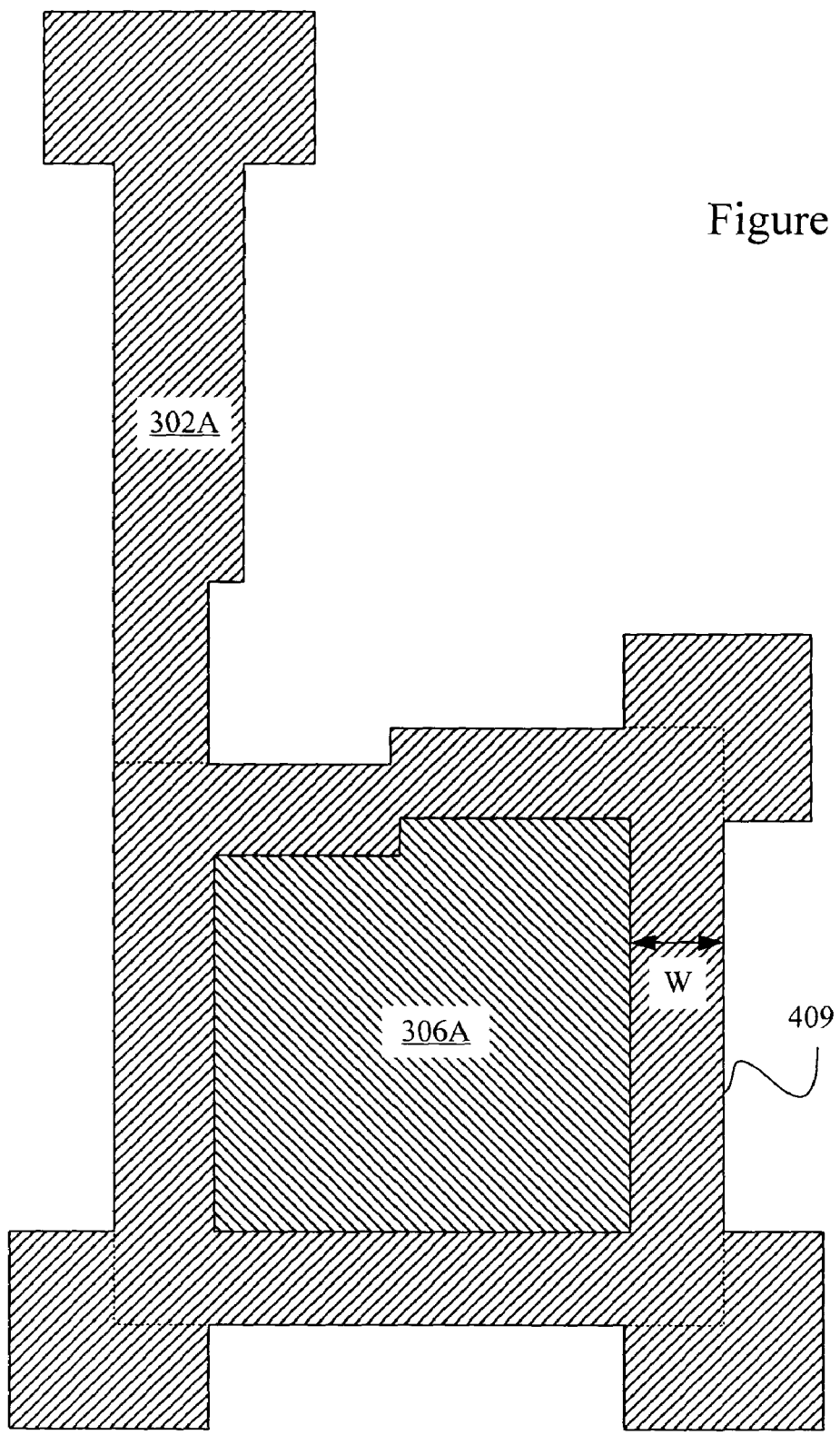
FIG. 4D illustrates modified layouts for the attenuated phase-shifting region and the opaque region.

In one illustrative downsizing and upsizing operation, attenuated region 302A could be downsized by 2× the rim width W and upsized by 1× the rim width W. However, if the optical proximity correction provides large hammerheads (or other OPC features), then the downsizing could be 3× the rim width W and the upsizing could be 2× the rim width W. Thus, in another operation, the downsizing and upsizing is adjusted as a function of the optical proximity corrections being applied. In yet another embodiment of the invention, the above-described downsizing and upsizing operation is replaced by a step of downsizing by 1× the rim width W and then eliminating any mousebites. Finally, in another embodiment, any size correction takes into account side lobe printing that may occur inside the feature. FIG. 4D shows illustrative modified layouts for attenuated phase-shifting region 302A and opaque layer 306A.

In one embodiment, steps 430 and 440 can be repeated until the width W of attenuated rim 409 is within tolerance (+/− a predetermined distance d, wherein d is based on the layout and tools in use). Steps 410–430 can be performed using any optical proximity correction (OPC) tool (current OPC tools include, but are not limited to, the Photolynx, iN Tandem, and SiVL tools from Numerical Technologies, Inc., the Dracula tool from Cadence Design Systems Inc., the Hercules tool from Avant! Corp., or the Calibre tool from Mentor Graphics Corp.). These OPC tools could be rule-based, model-based, or a combination of the two (i.e. certain segments using a rule, other segments using a model). Step 440 can be performed using any standard DRC (design rule checking) tool (current DRC tools include, but are not limited to, the dw-2000 from Design Workshop, the Hercules tool from Avant! Corp., the Dracula, Vampire, or Assura tools from Cadence Design Systems, or the Calibre tool from Mentor Graphics Corp.).

Figure 5A:
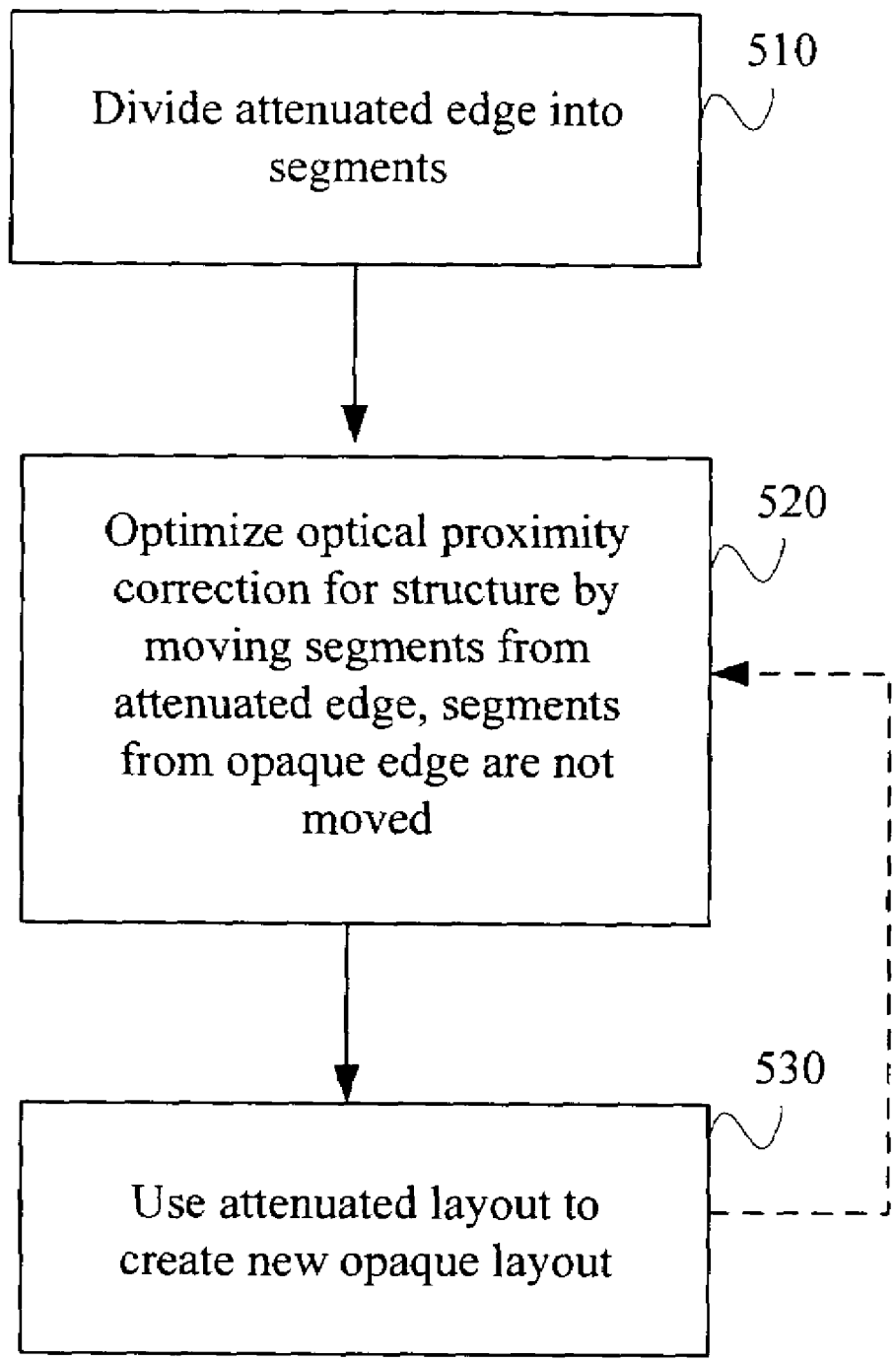
FIG. 5A illustrates another set of steps in accordance with the present invention to provide a substantially constant attenuated rim width across the layout of the integrated circuit.

FIG. 5A illustrates various steps in another embodiment of the invention to ensure that width W is achieved after structure 300 is corrected for optical proximity. As in the previous embodiment, these steps are typically performed on a layout structure using software until an optimized structure is formed. Then, the actual masks can be formed having the appropriate regions thereon, such as attenuated phase-shifting region 302 and opaque region 306.

In this embodiment, as described above in reference to FIG. 3, edges 301 are divided into segments having evaluation points thereon in step 510. At this point, optical proximity correction is performed on the structure in step 520. In accordance with this embodiment, edges 401 are not moved while segments of edges 301 are moved to correct for optical proximity. Once again, optimizing optical proximity correction for a structure may take multiple iterations. Therefore, after each iteration, a print simulation can be performed on the structure to determine if the placement of evaluation points 305 (FIG. 3) can be further optimized to achieve the desired layout. Thus, the locations of numerous segments of edges 301 may be modified during this optimization proximity correction step. Optical proximity correction (OPC) features, such as hammerheads, serifs, and biases, can be added to the structure in step 520.

Figure 5B:
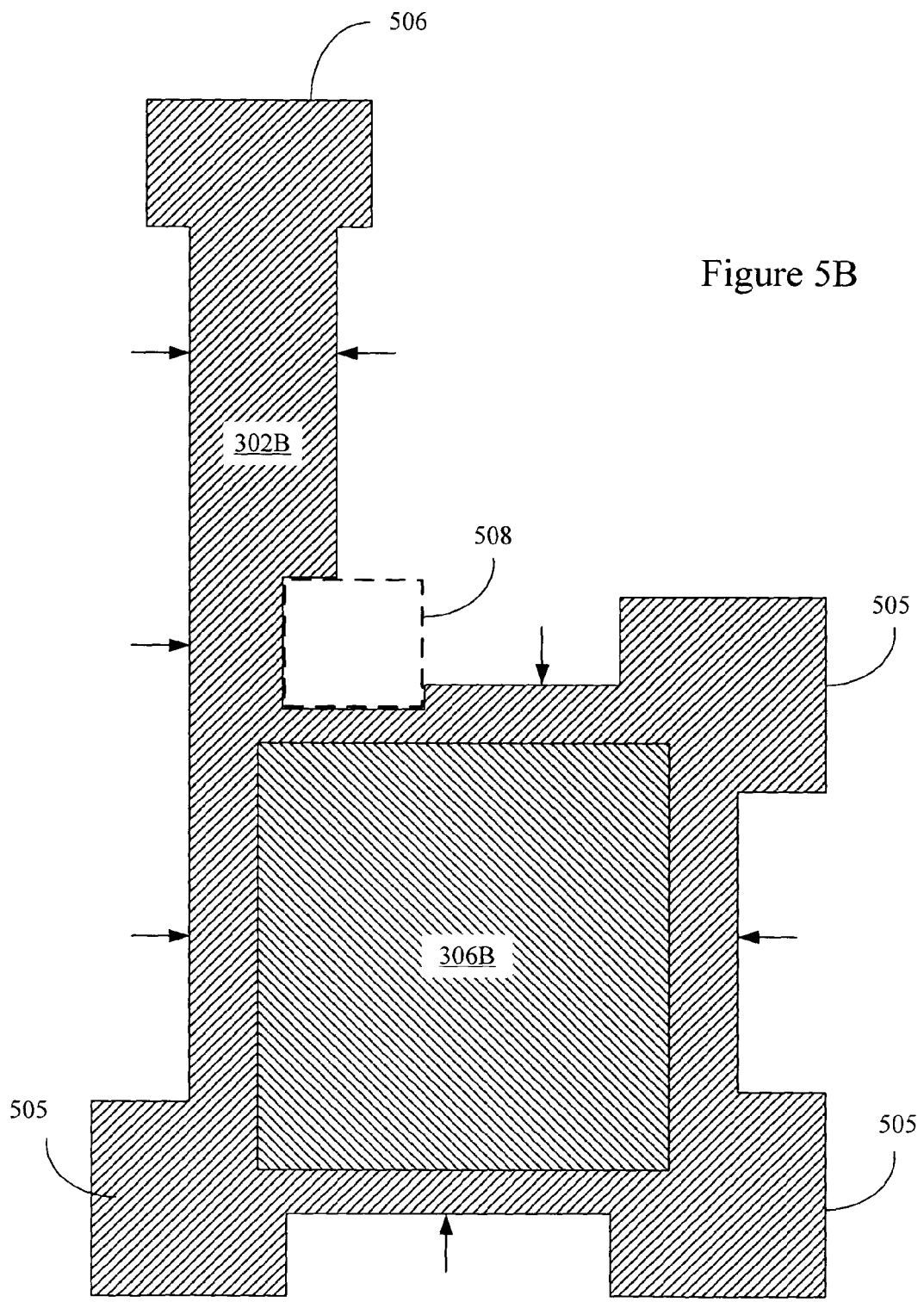
FIG. 5B illustrates the resulting edge modifications and additional OPC features to the attenuated phase-shifting region after standard optical proximity correction is performed.

FIG. 5B illustrates the resulting edge modifications and additional OPC features to attenuated phase-shifting region 302 after standard optical proximity correction is performed. Specifically, after optical proximity correction is performed on attenuated phase-shifting region 302, a hammerhead 506, an inner serif 508 (shown as a dotted box), and three outer serifs 505 have been added to the original structure. Moreover, the positions of various segments have been changed (an arrow indicating the direction of movement of the original segment(s) from an edge 301 (FIG. 3)).

However, note that these segments may not necessarily have moved as much as the corresponding segments in FIG. 4C (keeping in mind that the drawings are not meant to be to scale, but merely illustrative of the general concepts of the present invention). Further note that some of the OPC features of FIG. 5B could be significantly larger or smaller than the corresponding OPC features in FIG. 4C. These results can be explained by recognizing that the size of opaque region 306B is maintained from the original layout in this embodiment; whereas in the previous embodiment, the overall size of this opaque region is reduced. In other words, because the opaque region is considered in the OPC simulation step, the resulting OPC features and associated layout of the attenuated phase-shifting region can differ based on the size and shape of the opaque region.

At this point, the layout of attenuated phase-shifting region 302B can be used to create the desired layout for opaque region 306B in step 530. In one embodiment, the layout of attenuated phase-shifting region 302B is downsized and then upsized. This downsizing/upsizing operation eliminates any OPC features and ensures that the resulting opaque layout is free of any "mousebites". In one embodiment, steps 520 and 530 can be repeated until the width W of the attenuated rim is within tolerance, based on the layout and tools in use. Note that eventually, the layouts of attenuated phase-shifting region 302B and opaque region 306B in FIG. 5B will probably approximate the layouts shown in FIG. 4D.

Steps 510–520 can be performed using any optical proximity correction (OPC) tool (current OPC tools include, but are not limited to, the Photolynx, iN Tandem, and SiVL tools from Numerical Technologies, Inc., the Dracula tool from Cadence Design Systems Inc., the Hercules tool from Avant! Corp., or the Calibre tool from Mentor Graphics Corp.). These OPC tools could be rule-based, model-based, or a combination of the two (i.e. certain segments using a rule, other segments using a model). Step 530 can be performed using any standard DRC (design rule checking) tool (current DRC tools include, but are not limited to, the dw-2000 from Design Workshop, the Hercules tool from Avant! Corp., the Dracula, Vampire, or Assura tools from Cadence Design Systems, or the Calibre tool from Mentor Graphics Corp.).

Note that in one illustrative downsizing and upsizing operation, attenuated region 302B could be downsized by 2× the rim width W and upsized by 1× the rim width W. However, if the optical proximity correction provides large hammerheads (or other OPC features), then the downsizing could be increased to 3× the rim width W and the upsizing could be correspondingly increased to 2× the rim width W. Thus, the downsizing and upsizing can be adjusted as a function of the optical proximity corrections being applied. In yet another embodiment of the invention, the above-described downsizing and upsizing operation can be replaced by a step of downsizing by 1× the rim width W and then eliminating any mousebites. Finally, in another embodiment, any size correction can take into account side lobe printing that may occur inside the feature.

MODIFICATIONS TO THE EMBODIMENTS

The above-described embodiments are meant to be illustrative of the invention and not limiting. Modifications, alternatives, and variances to these embodiments may be apparent to those skilled in the art. For example, a mask fabricated according to the present invention could be used not only for optical lithography, but also for lithography based on other irradiation types, such as hard X-rays (typical wavelengths around 1 nanometer, wherein the mask is used in a transmission mode) or soft X-rays (also known as EUV, or extreme ultra violet, with typical wavelengths of approximately 10 nanometers, wherein the mask is used in a reflection mode)(note that a partially reflective material could also shift the light phase 180 degrees, either by a height differential or material composition difference).

In optical lithography, a mask of the present invention can be used with various wavelengths, including, for example, 436 nanometers, 365 nanometers, 248 nanometers, 193 nanometers, 157 nanometers, and 126 nanometers. In accordance with one embodiment of the present invention, the stepper illumination setting can be optimized for a given pattern type/size. For example, on-axis illumination could be used for isolated contacts, whereas off-axis illumination could be used for dense patterns (thereby changing the constant k of the equation to calculate rim width W).

In accordance with another embodiment of the present invention, the rim width is constant for similar structures, but not necessarily for different structures. For example, a first rim width could be determined as optimal for one type of structure, such as a line, and a second rim width could be determined as optimal for another type of structure, such as a contact. These different rim widths could be preserved locally or globally across the integrated circuit.

Finally, although the above embodiments may typically provide for attenuated phase-shifting regions having a transmission coefficient between approximately 0.3 and approximately 0.9, other embodiments could include attenuated phase-shifting regions much greater than 0.9. Accordingly, the present invention is intended to include all such modifications, alternatives, and variances that fall within the scope of the appended claims.

The invention claimed is:

1. A computer-readable medium embodying instructions that when executed by a processor would provide a tool set for simulating a tri-tone attenuated phase-shifting mask including a plurality of structures, a subset of the structures including a transparent region, an opaque region, and an attenuated region, wherein the opaque region and the attenuated region form a rim, the tool set comprising:

means for analyzing optical proximity correction for the subset of the structures;

means for providing a same rim width in the subset of the structures, wherein the means for providing includes:

means for dividing a first edge of the attenuated region into a plurality of first segments;

means for dividing a second edge of the opaque region into a plurality of second segments, wherein each second segment corresponds to a certain first segment; and means for determining whether a second segment moves with its corresponding first segment during optical proximity correction; and means for generating a layout consistent with the means for providing.

2. A computer-readable medium embodying instructions that when executed by a processor would provide a tool set for simulating a tri-tone attenuated phase-shifting mask including a plurality of structures, a subset of the structures including a transparent region, an opaque region, and an attenuated region, wherein the opaque region and the attenuated region form a rim, the tool set comprising:

means for analyzing optical proximity correction for the subset of the structures;

means for providing a same rim width in the subset of the structures, wherein the means for providing includes:

means for downsizing the attenuated region and then upsizing the attenuated region to generate the same rim width; and means for generating a layout consistent with the means for providing.

3. A computer-readable medium embodying instructions that when executed by a processor would provide a tool set to convert an integrated circuit layout into an attenuated phase-shifting mask layout for fabricating the integrated circuit, the tool set comprising:

means for identifying a subset of structures in the integrated circuit layout;

means for converting the subset of structures into the mask layout, wherein each converted structure includes a transparent region, an opaque region, and an attenuated region, wherein the opaque region and the attenuated region form a rim; means for analyzing optical proximity correction for a plurality of converted structures;

means for providing a same rim width for the plurality of converted structures, wherein the means for providing includes:

means for dividing a first edge of the attenuated region into a plurality of first segments;

means far dividing a second edge of the opaque region into a plurality of second segments, wherein each second segment corresponds to a certain first segment;

means for determining whether a second segment moves with its corresponding first segment during optical proximity correction; and means for generating a layout consistent with the means for providing.

4. A computer-readable medium embodying instructions that when executed by a processor would provide a tool set to convert an integrated circuit layout into an attenuated phase-shifting mask layout for fabricating the integrated circuit, the tool set comprising:

means for identifying a subset of structures in the integrated circuit layout;

means for converting the subset of structures into the mask layout, wherein each converted structure includes a transparent region, an opaque region, and an attenuated region, wherein the opaque region and the attenuated region form a rim;

means for analyzing optical proximity correction for a plurality of converted structures;

means for providing a same rim width for the plurality of converted structures, wherein the means for providing includes:

means for downsizing the attenuated region and then upsizing the attenuated region to generate the same rim width; and means for generating a layout consistent with the means for providing.

\* \* \* \* \*